(12) United States Patent
Jankowski

(10) Patent No.: US 11,585,837 B2
(45) Date of Patent: Feb. 21, 2023

(54) CURRENT MONITORING DEVICE

(71) Applicant: Phoenix Contact GmbH & Co. KG, Blomberg (DE)

(72) Inventor: Martin Jankowski, Seelze (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 67 days.

(21) Appl. No.: 17/263,989

(22) PCT Filed: Jul. 23, 2019

(86) PCT No.: PCT/EP2019/069737
§ 371 (c)(1),
(2) Date: Jan. 28, 2021

(87) PCT Pub. No.: WO2020/025385
PCT Pub. Date: Feb. 6, 2020

(65) Prior Publication Data
US 2021/0302475 A1    Sep. 30, 2021

(30) Foreign Application Priority Data
Aug. 1, 2018   (DE) ..................... 10 2018 118 670.3

(51) Int. Cl.
*G01R 15/20* (2006.01)
*G01R 1/04* (2006.01)

(52) U.S. Cl.
CPC ............. *G01R 15/207* (2013.01); *G01R 1/04* (2013.01)

(58) Field of Classification Search
CPC ................................ G01R 15/207; G01R 1/04
See application file for complete search history.

(56) References Cited

U.S. PATENT DOCUMENTS

| 2012/0319674 | A1* | 12/2012 | El-Essawy ............. G01R 35/04 324/74 |
| 2012/0319676 | A1 | 12/2012 | El-Essawy et al. |
| 2014/0167750 | A1 | 6/2014 | Akieda et al. |
| 2014/0210453 | A1* | 7/2014 | El-Essawy ........... G01R 15/142 324/126 |

FOREIGN PATENT DOCUMENTS

| DE | 2278344 | * | 1/2011 | ........... G01R 15/207 |
| DE | 202012103071 | U1 | 11/2012 | |
| DE | 102014119276 | A1 | 6/2016 | |
| DE | 102016123255 | A1 | 6/2018 | |
| EP | 2278344 | A2 | 7/2010 | |

* cited by examiner

*Primary Examiner* — Dominic E Hawkins
(74) *Attorney, Agent, or Firm* — Holland & Hart LLP

(57) ABSTRACT

A current monitoring device for detecting an electrical current in a line includes a housing bottom part, a first current sensor, a housing top part, and a second current sensor. The housing bottom part has a first wall in which a first wall bead is formed and configured to partially enclose the line. The first current sensor is arranged in the housing bottom part and obtains a first current measured value by measuring a current strength of the electric current. The housing top part has a second wall in which a second wall bead is formed and configured to partially enclose the line. The second current sensor is in the housing top part and obtains a second current measured value by measuring the current strength of the electric current. The first and second wall beads align with one another to at least partially enclose the electrical line.

18 Claims, 3 Drawing Sheets

CURRENT MONITORING DEVICE

CROSS-REFERENCE

The present application is the U.S. national stage entry of PCT/EP2019/069737 by JANKOWSKI, entitled "CURRENT MONITORING DEVICE," which was filed on Jul. 23, 2019, and claims the benefit of German Patent Application No. 10 2018 118 670.3 by JANKOWSKI, entitled "STROMUEBERWACHUNGSVORRICHTUNG," which was filed on Aug. 1, 2018. These applications are incorporated by reference herein in their entirety for all purposes.

FIELD OF THE DISCLOSURE

The present disclosure relates to a current monitoring device for detecting an electrical current in a line.

BACKGROUND

Current monitoring devices can be used in particular to detect errors and increase efficiency in photovoltaic systems. In particular, a current monitoring device can be adapted to detect a drop in power, for example due to contamination or damage to the lines or the photovoltaic system. A current detection can be realized in particular by means of Hall sensors in order to enable a contactless measurement of a current flow through the line. Known current monitoring systems typically have a closed line bushing and/or only allow partial current measurement at the line. Accordingly, it may be disadvantageously necessary to provide a current monitoring device at the time of installation of the respective line and/or to cut the line in order to implement a feed-through through the current monitoring device.

SUMMARY

It is the object of the present disclosure to provide a more efficient current monitoring device which can be detachably arranged at the line without modification of the line, in particular non-destructively and/or without an electrical plug connection.

This object is achieved by the features of the independent claim. Advantageous implementations are the subject matter of the dependent claims, the description and the accompanying figures.

The present disclosure is based on the knowledge that the above object can be achieved by a two-part current monitoring device comprising a housing bottom part and an housing top part. The housing parts can be placed on top of one another, in particular are aligned with one another, wherein at least one receiving space for receiving an electrical line is formed when the housing parts are aligned with one another. At least one current sensor for detecting an electrical current in the line is arranged both in the housing top part and in the housing bottom part. Furthermore, the housing parts can be connected to one another mechanically, in particular releasably.

According to a first aspect, the disclosure relates to a current monitoring device for detecting an electrical current in a line. The current monitoring device comprises a housing bottom part which has a first wall in which a first wall bead is formed and provided in order to partially enclose the line, and a housing top part which has a second wall in which a second wall bead is formed and provided, in order to also partially enclose the line.

Furthermore, the current monitoring device comprises a first current sensor and a second current sensor for each measuring a current strength of the electric current in order to obtain a first current measured value and a second current measured value. The first current sensor is arranged in the first housing part and the second current sensor is arranged in the housing top part. The housing top part can be placed on the housing bottom part such that the first wall bead and the second wall bead are aligned with one another and together at least partially enclose the electrical line.

The current monitoring device can in particular be adapted to measure a current strength of an electrical current in a single-core line which is inserted into the first wall bead and the second wall bead. The current strength can be detected in a contactless manner through an insulating layer, in particular through a plastic sheathing of the line and/or the respective wall.

The current sensors are adapted to be arranged at the smallest possible measuring distance from an electrically conductive core of the line in order to increase the accuracy of the current measurement by the current sensors. A measurement distance of the current sensor from the electrically conductive core can be determined by a thickness of the insulation layer and/or a thickness of the respective wall. The current sensors can also be embedded in the respective wall in order to reduce the measuring distance.

The current monitoring device can be part of a monitoring system for monitoring line currents, wherein a plurality of lines can be monitored simultaneously. In particular, the current monitoring device can be used to detect current strengths in lines of a solar system.

As a result of the two-part design of the current monitoring device with the housing bottom part and the housing top part, the current monitoring device can be arranged at the line without separating the line. The housing bottom part and the housing top part can be arranged at the line and enclose it along a circumference, so that the current sensors are arranged along a circumference around the line.

The first wall bead and the second wall bead can in particular be adapted to receive the line in a form-fitting manner in order to detachably hold the line in the respective bead. The insulating layer of the line can be flexible and/or compressible so that the line can be introduced into the respective bead by means of bending or pressing. Correspondingly, the line can be fastened in the first wall bead and/or in the second wall bead by means of a force-fitting connection.

In one example, the first current sensor is arranged in the housing bottom part at the first wall bead, and the second current sensor is arranged in the housing top part at the second wall bead. This has the advantage that the current sensors are arranged at a minimal distance from the line in order to achieve an increased accuracy of the current measurement.

The housing bottom part can enclose a first housing interior and the first current sensor can be arranged on a surface of the first wall bead facing the first housing interior. Furthermore, the housing top part can enclose a second housing interior and the second current sensor can be arranged in the second housing interior at a surface of the second wall bead facing the second housing interior. Correspondingly, the first current sensor is arranged inside the housing bottom part and the second current sensor is arranged inside the housing top part, whereby the current sensors can be protected from external environmental influences.

In one example, the first wall bead is aligned with the second wall bead when the housing bottom part is placed on the housing top part in order to form a receiving space for the line.

The receiving space can in particular be a circular channel having a constant diameter. The receiving space can extend straight or curved on the walls. The wall beads can be u-shaped so that a u-shaped receiving space is formed for inserting the cable. A sealing means can be arranged in the first wall bead and/or the second wall bead, wherein it is possible for the line to be enclosed in a sealing manner by means of the sealing means when the housing bottom part is placed on the housing top part. The sealing means can be liquid, pasty or gel-like, or it can be formed by an elastomer seal.

In one example, the first current sensor and/or the second current sensor are arranged along a circumference around the receiving space at a predetermined radial distance from a center line of the receiving space. This has the advantage that each current sensor has a predetermined, in particular the same measurement distance from the electrical line. Furthermore, the sensors can be adapted to provide consistent current measured values that are comparable to one another having a known measuring distance of the respective sensors. In particular, the measured current strength values can be averaged in order to advantageously reduce a measurement error in the current strength detection. Furthermore, different radial distances between the sensors and the center line of the receiving space can also be compensated for by the averaged value. The sensors can be arranged at different radial distances from the center line of the receiving space, for example due to manufacturing-related tolerances and/or design-related specifications. Furthermore, the respective distance between the sensors and an electrically conductive core of the line can vary if the line is not arranged exactly in the center of the receiving space.

In one example, the current monitoring device comprises a plurality of current sensors, wherein a first number of current sensors of the plurality of current sensors is arranged on the first wall, and a second number of current sensors of the plurality of current sensors, which are arranged on the second wall. A measurement error in the current strength measurement by means of the current monitoring device can be inversely proportional to the number of current sensors used. Accordingly, an accuracy of current measurement can be improved by increasing the number of current sensors. In particular, the current sensors can be arranged uniformly at a fixed distance from one another on a circumference around the line. The first current sensor can be comprised of the first number of current sensors and/or the second current sensor can be comprised of the second number of current sensors.

In one example, the first wall has a plurality of first wall beads and the second wall has a plurality of second wall beads, wherein the first wall beads and/or the second wall beads have a semicircular cross section and/or extend at a distance from one another and/or extend in a straight line. The first wall beads are aligned with the corresponding second wall beads when the housing bottom part is placed on the housing top part, in order to form a plurality of receiving spaces for a plurality of lines.

This has the advantage that a current measurement can be implemented at a plurality of lines. The corresponding first wall beads and second wall beads can each have at least one current sensor for each line in order to detect a current flow in the respective line.

In one example, the housing bottom part has a plurality of latching connectors and the housing top part has a plurality of latching connector receptacles. The latching connectors are adapted to engage in the latching connector receptacles when the second wall is placed on the first wall, in order to fix the housing top part on the housing bottom part.

This has the advantage that the housing bottom part can be mechanically, in particular detachably, connected to the housing top part. Correspondingly, the connection between the housing bottom part and the housing top part can be released again after the housing parts have been fixed in order, for example, to arrange further lines between the housing parts. The latching connections can have a form-fit connection and/or a force-fit connection between the latching connectors and the latching connector receptacles.

In one example, the housing parts are fixed to one another by means of at least one screw connection, a clamping connection and/or a cable binder. The housing top part and/or the housing bottom part can be adapted and/or shaped accordingly to mechanically support the respective fastening.

In one example, the housing bottom part and/or the housing top part each have at least one latching connector and one latching connector receptacle. When the housing parts are placed on top of one another in an aligned manner, one latching connector receptacle can correspondingly be aligned to a latching connector of the other housing part. The latching connection can in particular be opened again manually and/or without tools. The latching connection can also be opened non-destructively in order to enable the housing parts to be fixed again.

The latching connector receptacles and/or the latching connectors can be arranged laterally at an end face of the respective housing parts and protrude beyond the respective wall. Accordingly, the latching connectors are accessible from the outside after the housing parts have been joined together.

In one example, the housing bottom part and the housing top part each have a first housing half and a second housing half, which each enclose a housing interior and/or are connected by means of a sealing means in order to seal the respective housing interior against liquids, gases and/or foreign bodies.

This has the advantage that components of the current monitoring device arranged within the housing parts can be protected from external environmental influences. In particular, the respective housing interior can be sealed by means of the respective sealing means according to a protection class, in particular protection class IP67. The housing halves can be shell-shaped molded parts, which can in particular be made from an electrically insulating plastic. The housing halves can in particular be adapted to be transparent to electromagnetic signals and/or to have reduced attenuation in relation to electromagnetic signals. The sealing means can in particular be a circumferential, flexible elastomer seal which is arranged on a connecting edge of the respective housing halves.

In one example, the current monitoring device comprises a first wireless transmission interface, which is arranged in the housing bottom part at the first wall, and a second wireless transmission interface, which is arranged in the housing top part at the second wall, wherein the housing bottom part with the first wall can be placed on the second wall of the housing top part. When the housing bottom part is placed on the housing top part, the first transmission interface is aligned with the second transmission interface.

With the alignment of the transmission interfaces with respect to one another, the advantage can be achieved that an active transmission surface of the first transmission interface forms an overlap area as large as possible having an active transmission surface of the second transmission interface. The larger the overlap area, the higher the signal-to-noise ratio of electrical signals that are transmitted wirelessly via an electrical connection between the transmission interfaces. Furthermore, a connection quality, in particular a connection stability of the electrical connection, can depend on the size of the overlap area and/or a distance between the transmission interfaces. With the arrangement of the respective transmission interface on the respective wall, the respective transmission interface can be protected from external environmental influences.

In one example, the wireless transmission interfaces are adapted to generate a wireless communication link for transmitting an electrical signal, when the wireless transmission interfaces are aligned with one another in order to provide the first measured current value and the second measured current value to a processing device.

In one example, the wireless transmission interfaces are adapted to be electromagnetically coupled to one another through the first wall and through the second wall. In particular, the transmission interfaces can be inductively and/or capacitively coupled to one another in order to transmit both current measurement data and electrical energy for supplying energy to the current sensors.

In one example, the wireless transmission interfaces are adapted to transmit electrical energy for supplying voltage to the current sensors and data for reading out the current sensors between the housing bottom part and the housing top part.

The wireless transmission interfaces can each be arranged on a separate circuit board within the respective housing part. Furthermore, the current sensors can also be arranged in each case and/or in a composite on a further printed circuit board. Furthermore, the current sensors can be isolated from electromagnetic radiation, which is generated by the wireless transmission interfaces, and/or can be arranged at a distance from the wireless transmission interfaces in order to prevent crosstalk of signals from the wireless transmission interfaces to the current sensors.

In one example, the first current sensor and/or the second current sensor are adapted to wirelessly detect a current strength of the electrical current flowing through the line, wherein the first current sensor and/or the second current sensor are electrically isolated from the line. This has the advantage of a contactless current measurement. In particular, the current sensors can be adapted to detect a magnetic field generated by the current flow in the line.

In one example, the current monitoring device comprises a processing device which is adapted to process the first measured current value and the second measured current value in order to increase the accuracy of the measured current intensity of the electrical current flow in the line. The processing device can be arranged in the housing bottom part or in the housing top part, wherein the sensor data of the current sensor in the respective other housing part is fed to the processing unit via the wireless transmission interfaces.

In one example, the processing device is adapted to calibrate the first current sensor and the second current sensor. The calibration can take place on the basis of the first current measured value and the second current measured value.

In one example, the first current sensor and/or the second current sensor each have a magnetoresistive current detection element and/or a Hall probe and/or a Förster probe. Further types of current detection sensors can also be provided.

In one example, the current monitoring device comprises a communication interface which is adapted to provide a first number of current measured values, in particular the first current measured value, which are recorded in the housing bottom part and/or a second number of measured current values, in particular the second measured current value, which are recorded in the housing top part, for reading. This has the advantage that the current measured values can be aggregated at a centrally and/or remotely arranged processing point in order to record and monitor a plurality of line currents at the processing point. The communication interface can be a wireless or wired interface. The current values that can be read refer to the line through the housing. The current values from the housing bottom part and the current values from the housing top part can be combined into one current value per line.

In one example, the current monitoring device can be connected to a further current monitoring device, and the communication interface is adapted to receive current measured values from the further current monitoring device in order to feed the current measured values of the current monitoring device and the further current monitoring device to a processing device.

In one example, the housing bottom part and/or the housing top part each have an alignment mark which is adapted to provide a monitoring option for the alignment of the housing bottom part in relation to the housing top part when the housing bottom part is placed on the housing top part, and wherein the alignment marks come to rest congruently when the housing bottom part is placed on the housing top part.

In one example, the housing bottom part and/or the housing top part each have a mounting device with which the respective housing part can be fastened to a support rail.

BRIEF DESCRIPTION OF THE DRAWINGS

Further exemplary implementations are explained with reference to the accompanying figures. They show.

DETAILED DESCRIPTION

Figure 1:
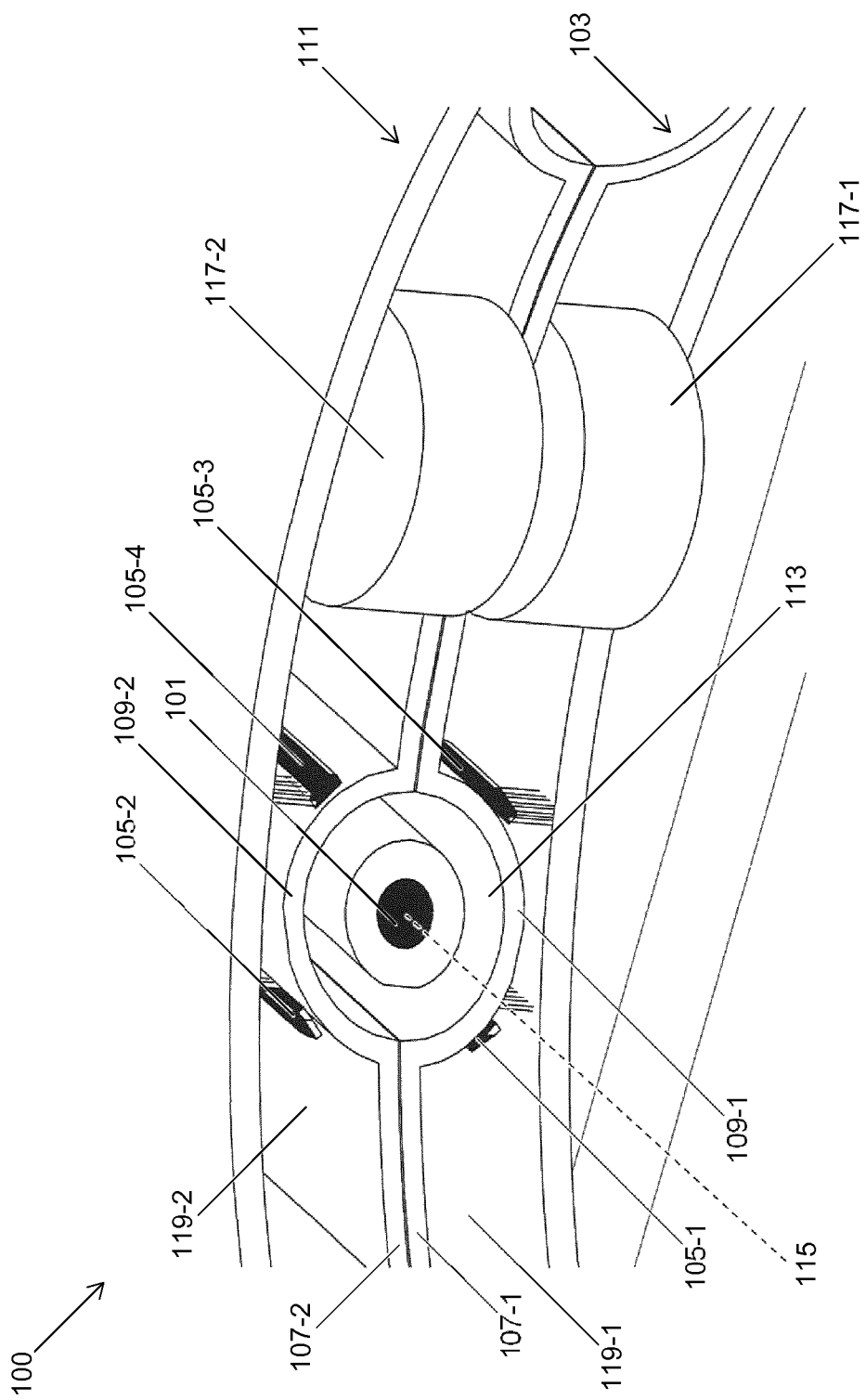
FIG. 1 shows a current monitoring device in one example.

FIG. 1 shows a schematic cross-sectional view of a current monitoring device 100 for detecting an electrical current in a line 101. The current monitoring device 100 comprises a housing bottom part 103 which has a first wall 107-1 in which a first wall bead 109-1 is formed and provided to partially enclose the line 101 and an housing top part 111, which has a second wall 107-2, in which a second wall bead 109-2 is formed and provided to partially enclose the line 101.

The current monitoring device 100 further comprises a first current sensor 105-1 for measuring a current strength of the electric current in order to obtain a first current measured value, wherein the first current sensor 105-1 is arranged in the housing bottom part 103, and a second current sensor 105-2 for measuring the current strength of the electrical current in order to obtain a second current measured value, wherein the second current sensor 105-2 is arranged in the housing top part 111.

The housing top part 111 can be placed on the housing bottom part 103 such that the first wall bead 109-1 and the second wall bead 109-2 are aligned with one another and together at least partially enclose the electrical line 101. Furthermore, when the housing bottom part 103 is placed on the housing top part 111, the first wall bead 109-1 is aligned with the second wall bead 109-2 in order to form a receiving space 113 for the line 101.

The current monitoring device 100 further comprises a third current sensor 105-3 and a fourth current sensor 105-4. The first current sensor 105-1 and the third current sensor 105-3 are arranged in the housing bottom part 103 on the first wall bead 109-1 and the second current sensor 105-2 and the fourth current sensor 105-4 are arranged in the housing top part 111 on the second wall bead 109-2 arranged. Furthermore, the current sensors 105-1, 105-2, 105-3, 105-4 are arranged along a circumference around the receiving space 113 at a predetermined radial distance from a center line 115 of the receiving space 113. The current sensors 105-1, 105-2, 105-3, 105-4 are also adapted to detect a magnetic field resulting from the electric current through the line 101 in order to wirelessly detect a current strength of the electric current flowing through the line 101. Furthermore, the current sensors 105-1, 105-2, 105-3, 105-4 are electrically isolated from the line 101. The current sensors 105-1, 105-2, 105-3, 105-4 are furthermore arranged at a uniform distance along a circumference around the center line 115.

The current sensors 105-1, 105-2, 105-3, 105-4 can each have an identical distance from the line 101. The line 101 is adapted to be rotationally symmetrical, so that each current sensor 105-1, 105-2, 105-3, 105-4 detects the same magnetic field strength. Accordingly, the measurement signal amplitudes of the current sensors 105-1, 105-2, 105-3, 105-4 can be the same as one another. Deviations of the measured values from the current intensity actually flowing can be generated by component tolerances in the respective current sensor 105-1, 105-2, 105-3, 105-4. With the plurality of current sensors 105-1, 105-2, 105-3, 105-4, on the one hand, an advantageous redundancy of the current measurement can be achieved and/or a measurement accuracy can be achieved by averaging the measured values. If the respective distance between the current sensors 105-1, 105-2, 105-3, 105-4 is not identical, for example if the electrically conductive core of the line 101 is not arranged exactly in the middle in the receiving space 113, the current can be determined by a suitable calculation of the individual measured values of the current sensors 105-1, 105-2, 105-3, 105-4.

The current monitoring device 100 further comprises a first wireless transmission interface 117-1, which is arranged in the housing bottom part 103 at the first wall 107-1, and a second wireless transmission interface 117-2, which is arranged in the housing top part 111 at the second wall 107-2. The housing bottom part 103 can be placed with the first wall 107-1 on the second wall 107-2 of the housing top part 111. When the housing bottom part 103 is placed on the housing top part 111, the first transmission interface 117-1 is aligned with the second transmission interface 117-2.

The wireless transmission interfaces 117-1, 117-2 are adapted to generate a wireless communication link for transmitting an electrical signal when the wireless transmission interfaces 117-1, 117-2 are aligned with one another, in order to provide the first measured current value and the second measured current value to a processing device and/or to generate an energy supply connection for supplying the current sensors 105-2, 105-4 in the housing top part 111 with electrical energy. Furthermore, the wireless transmission interfaces 117-1, 117-2 are adapted to be electromagnetically coupled to one another through the first wall 107-1 and through the second wall 107-2.

The housing bottom part 103 and the housing top part 111 each have a similar surface shape in order to realize a form-fitting contact between the walls 107-1, 107-2

Figure 2:
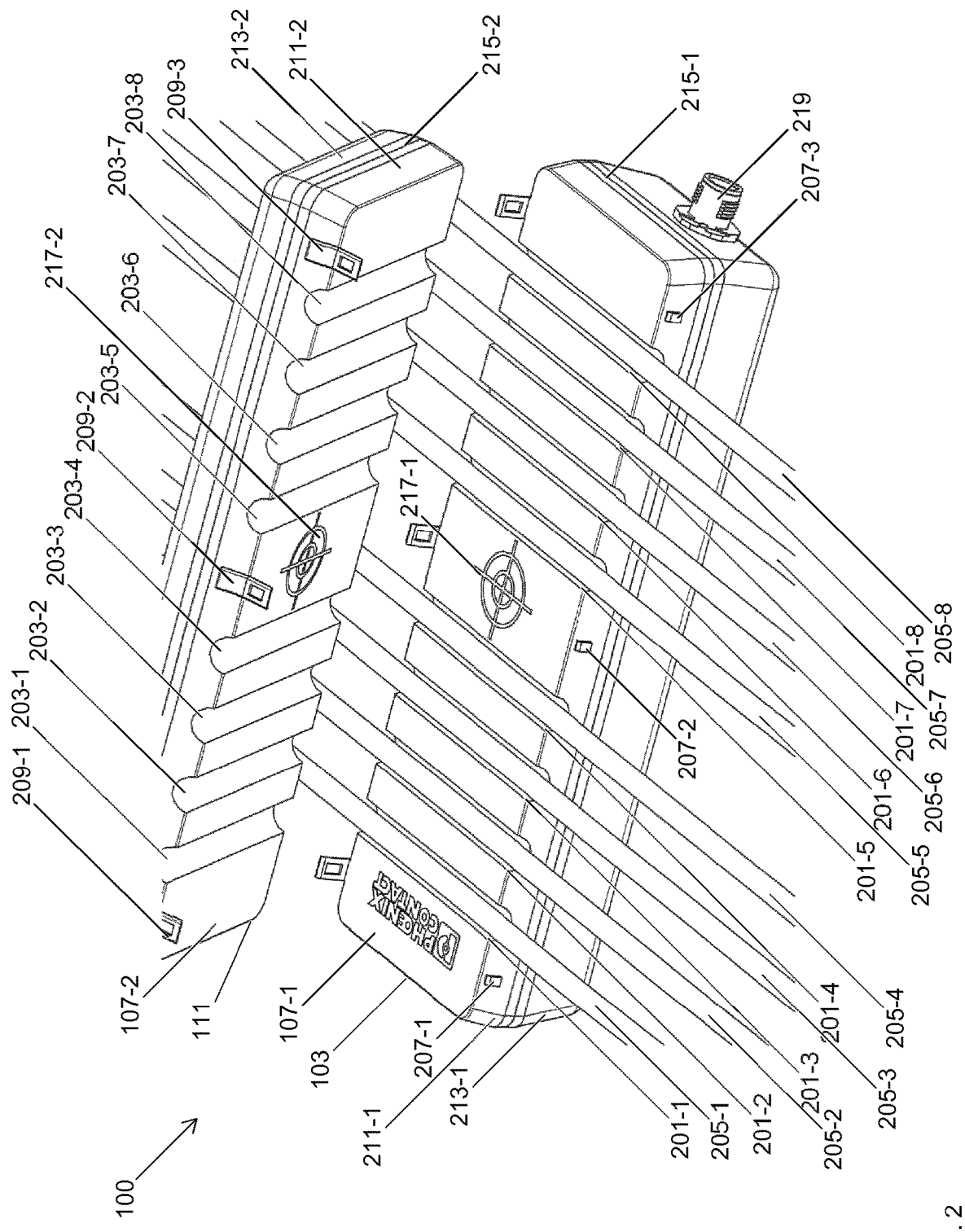
FIG. 2 shows a current monitoring device in one example.

FIG. 2 shows a schematic perspective view of a current monitoring device 100 for detecting electrical currents in a plurality of lines 205-1 to 205-8. The current monitoring device 100 comprises a housing bottom part 103, which has a first wall 107-1, in which a plurality of first wall beads 201-1 to 201-8 are formed and provided to partially enclose the lines 205-1 to 205-8 and an housing top part 111 which has a second wall 107-2 in which a plurality of second wall beads 203-1 to 203-8 are formed and provided to partially enclose the lines 205-1 to 205-8.

The housing top part 111 can be placed on the housing bottom part 103 such that the plurality of first wall beads 201-1 to 201-8 and the plurality of second wall beads 203-1 to 203-8 are aligned in pairs, and enclose the electrical lines 205-1 to 205-8 together in pairs. Furthermore, when the housing bottom part 103 is placed on the housing top part 111, the plurality of first wall beads 201-1 to 201-8 are aligned with the plurality of second wall beads 203-1 to 203-8 in order to provide receiving spaces for the lines 205-1 to 205-8.

The first wall beads 201-1 to 201-8 and the second wall beads 203-1 to 203-8 each have a semicircular cross section and extend at a distance from one another and in a straight line.

The housing bottom part 103 also has three latching connectors 207-1, 207-2, 207-3 and the housing top part 111 has three latching connector receptacles 209-1, 209-2, 209-3. The latching connectors 207-1, 207-2, 207-3 are adapted to engage in the latching connector receptacles 209-1, 209-2, 209-3 when the second wall 107-2 is placed on the first wall 107-1, in order to fix the housing top part 111 on the housing bottom part 103. Furthermore, latching connectors can also be arranged at the housing top part 111 and latching connector receptacles can also be arranged at the housing bottom part 103, which interlock when the housing parts 103, 111 are joined together.

The housing bottom part 103 and the housing top part 111 each have a first housing half 211-1, 211-2 and a second housing half 213-1, 213-2, which are each connected by means of a sealing means 215-1, 215-2, in order to seal the respective housing interior 119-1, 119-2 against liquids, gases and/or foreign bodies.

The housing bottom part 103 and/or the housing top part 111 each have an alignment mark 217-1, 217-2 which, when the housing bottom part 103 is placed on the housing top part 111, provides a means of monitoring the alignment of the housing bottom part 103 in relation to the housing top part 111. The alignment markings 217-1, 217-2 can be adapted to come to rest congruently when the housing bottom part 103 is placed on the housing top part 111. The alignment marks 217-1, 217-2 can in particular have concentric rings and radial lines. The radial lines can run at an angle, in particular at right angles, to one another. An intersection of the radial lines and/or a center point of the concentric rings can each define a target support point on the walls 107-1, 107-2. When the housing bottom part 103 is placed on the housing top part 111, the respective target support points can be aligned congruently and come to rest. An alignment of the housing top part 111 to the housing bottom part 103 can also be realized by means of the housing shape and/or the latching connectors provided at the housing parts 111, 103.

A form-fitting joining of the housing parts 111, 103 can be clearly defined by the latching connector.

A supply connection 219, to which an electrical supply line can be connected by means of a plug-in and/or screw connection, is also arranged at the housing bottom part 103. The current monitoring device 100 can be supplied with electrical energy and/or a communication interface of the current monitoring device 100 can receive and/or send data via the supply connection 219.

Figure 3:
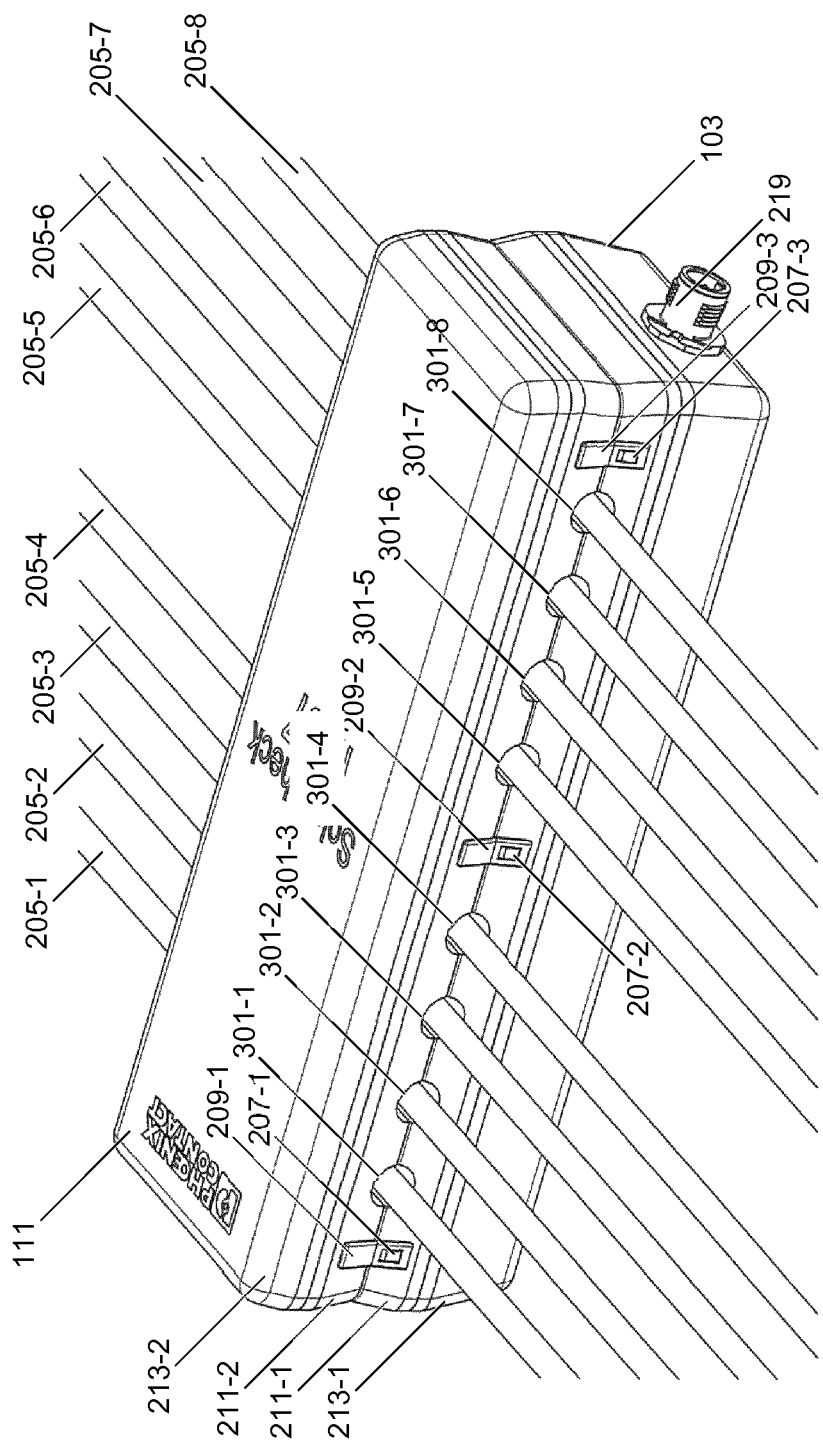
FIG. 3 shows a current monitoring device in one example.

FIG. 3 shows a schematic perspective view of a current monitoring device 100 according to the embodiment shown in FIG. 2. The housing top part 111 is aligned with the housing bottom part 103 and lies flat on it. Furthermore, the latching connectors 207-1, 207-2, 207-3 engage in the latching connector receptacles 209-1, 209-2, 209-3 in order to hold the housing top part 111 on the housing bottom part 103. The beads formed in the first wall 107-1 and the second wall 107-2 form the receiving spaces 301-1 to 301-8 for the lines 205-1 to 205-8.

LIST OF REFERENCE NUMBERS 100 current monitoring device
101 line
103 housing bottom part
105-1 first current sensor
105-2 second current sensor
105-3 current sensor
105-4 current sensor
107-1 first wall
107-2 second wall
109-1 first wall bead
109-2 second wall bead
111 housing top part
113 recording space
115 center line
117-1 first wireless transmission interface
117-2 second wireless transmission interface
119-1 housing interior
119-2 housing interior
201-1 wall bead
201-2 wall bead
201-3 wall bead
201-4 wall bead
201-5 wall bead
201-6 wall bead
201-7 wall bead
201-8 wall bead
203-1 wall bead
203-2 wall bead
203-3 wall bead
203-4 wall bead
203-5 wall bead
203-6 wall bead
203-7 wall bead
203-8 wall bead
205-1 line
205-2 line
205-3 line
205-4 line
205-5 line
205-6 line
205-7 line
205-8 line
207-1 latching connector
207-2 latching connector
207-3 latching connector
209-1 latching connector receptacle
209-2 latching connector receptacle
209-3 latching connector receptacle
211-1 First housing half
211-2 First housing half
213-1 Second housing half
213-2 Second housing half
215-1 sealing means
215-2 sealing means
217-1 alignment mark
217-2 alignment mark
219 supply connection
301-1 receiving space
301-2 receiving space
301-3 receiving space
301-4 receiving space
301-5 receiving space
301-6 receiving space
301-7 receiving space
301-8 receiving space

What is claimed is:

1. A current monitoring device for detecting an electrical current in a line, comprising:
a housing bottom part comprising a first wall, wherein a first wall bead is formed in the first wall and configured to partially enclose the line;
a first current sensor configured to obtain a first current measured value by measuring a current strength of the electrical current, wherein the first current sensor is arranged in the housing bottom part;
a housing top part comprising a second wall, wherein a second wall bead is formed in the second wall and configured to partially enclose the line;
a second current sensor configured to obtain a second current measured value by measuring the current strength of the electrical current, wherein the second current sensor is arranged in the housing top part; and
a first wireless transmission interface arranged in the housing bottom part at the first wall and a second wireless transmission interface arranged in the housing top part at the second wall, wherein:
the housing top part is configured to be placed on the housing bottom part such that the first wall bead and the second wall bead are aligned with one another and together at least partially enclose the line,
the housing bottom part with the first wall can be placed on the second wall of the housing top part,
the first wireless transmission interface is aligned with the second wireless transmission interface when the housing bottom part is placed on the housing top part, and
the first wireless transmission interface and the second wireless transmission interface are adapted to electromagnetically couple through the first wall and through the second wall.

2. The current monitoring device according to claim 1, wherein the first current sensor is arranged in the housing bottom part at the first wall bead, and wherein the second current sensor is arranged in the housing top part at the second wall bead.

3. The current monitoring device according to claim 1, wherein the first wall bead is aligned with the second wall bead when the housing bottom part is placed on the housing top part to form a receiving space for the line.

4. The current monitoring device according to claim 3, wherein one or more of the first current sensor or the second current sensor is arranged along a circumference around the receiving space at a fixed radial distance from a center line of the receiving space.

5. The current monitoring device according to claim 3, wherein the first wall bead is one of a plurality of first wall beads formed in the first wall, and the second wall bead is one of a plurality of second wall beads formed in the second wall, wherein each of the first wall bead and the second wall bead comprises a semicircular cross section, wherein the first wall bead and the second wall bead are spaced apart and extend in a straight line, and wherein the first wall bead are aligned with corresponding ones of the second wall bead when the housing bottom part is placed on the housing top part to accommodate receiving spaces for a plurality of lines.

6. The current monitoring device according to claim 1, wherein the first current sensor and the second current sensor are in a plurality of current sensors, wherein a first number of current sensors of the plurality of current sensors is arranged at the first wall, the first number of current sensors including the first current sensor, and a second number of current sensors of the plurality of current sensors is arranged at the second wall, the second number of current sensors including the second current sensor.

7. The current monitoring device according to claim 1, wherein the housing bottom part comprises a plurality of latching connectors and the housing top part comprises a plurality of latching connector receptacles, wherein the plurality of latching connectors are configured to engage in the plurality of latching connector receptacles when the second wall is placed on the first wall such that the housing top part is fixed on the housing bottom part.

8. The current monitoring device according to claim 1, wherein each of the housing bottom part and the housing top part comprises a first housing half and a second housing half which enclose a housing interior and are connected such that the housing interior is sealed against one or more of liquids, or gases, or foreign bodies.

9. The current monitoring device according to claim 1, wherein the first wireless transmission interface and the second wireless transmission interface are configured to provide a wireless communication link for transmitting an electrical signal, when the first wireless transmission interface and the second wireless transmission interface are aligned with each other, wherein the first current measured value and the second current measured value are provided to a processing device via the first wireless transmission interface and the second wireless transmission interface.

10. The current monitoring device according to claim 1, wherein the first wireless transmission interface and the second wireless transmission interface are adapted to transmit electrical energy for supplying voltage to the first current sensor and the second current sensor and data for reading out the first current sensor and the second current sensor between the housing bottom part and the housing top part.

11. The current monitoring device according to claim 1, wherein the first current sensor and the second current sensor are adapted to detect a magnetic field resulting from the electrical current through the line to wirelessly detect the current strength of the electrical current flowing through the line, and wherein the first current sensor and the second current sensor are electrically isolated from the line.

12. The current monitoring device according to claim 1, further comprising a processing device configured to process the first current measured value and the second current measured value to increase an accuracy of the measured current strength of the electrical current flow in the line.

13. The current monitoring device according to claim 12, wherein the processing device is adapted to calibrate the first current sensor and the second current sensor.

14. The current monitoring device according to claim 1, wherein one or more of the first current sensor or the second current sensor comprises one or more of a magnetoresistive current detection element, or a Hall probe, or a Förster probe.

15. The current monitoring device according to claim 1, further comprising a communication interface configured to enable reading a first number of current measured values recorded in the housing bottom part or a second number of measured current values recorded in the housing top part.

16. The current monitoring device according to claim 15, wherein the current monitoring device is configured to connect to a further current monitoring device, and wherein the communication interface is adapted to receive measured current values from the further current monitoring device and supply the measured current values of the current monitoring device and the further current monitoring device to a processing device.

17. The current monitoring device according to claim 1, wherein each of the housing bottom part and the housing top part comprises a mounting device configured to attach to a mounting rail.

18. The current monitoring device according to claim 1, wherein each of the housing bottom part and the housing top part comprises an alignment mark configured to provide a reference for monitoring an alignment of the housing bottom part in relation to the housing top part when the housing bottom part is placed on the housing top part, and wherein the alignment mark of the housing bottom part and the alignment mark of the housing top part come to bear congruently when the housing bottom part is placed on the housing top part.

* * * * *